(12) United States Patent
Li et al.

(10) Patent No.: US 9,040,159 B2
(45) Date of Patent: May 26, 2015

(54) ELECTRONIC ELEMENT HAVING CARBON NANOTUBES

(75) Inventors: Qun-Qing Li, Beijing (CN); Kai-Li Jiang, Beijing (CN); Liang Liu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 926 days.

(21) Appl. No.: 12/286,143

(22) Filed: Sep. 29, 2008

(65) Prior Publication Data
US 2011/0171419 A1 Jul. 14, 2011

(30) Foreign Application Priority Data
Dec. 12, 2007 (CN) .......................... 2007 1 0125102

(51) Int. Cl.
| | |
|---|---|
| B32B 5/12 | (2006.01) |
| B32B 17/06 | (2006.01) |
| B32B 3/00 | (2006.01) |
| B32B 9/00 | (2006.01) |
| D01F 9/12 | (2006.01) |
| H01L 31/0224 | (2006.01) |
| B82Y 10/00 | (2011.01) |
| B82Y 30/00 | (2011.01) |
| H01L 51/00 | (2006.01) |
| H01L 51/10 | (2006.01) |

(Continued)

(52) U.S. Cl.
CPC .......... *H01L 31/022466* (2013.01); *B82Y 10/00* (2013.01); *B82Y 30/00* (2013.01); *H01L 51/0048* (2013.01); *H01L 51/102* (2013.01); *H01L 51/444* (2013.01); *H01L 31/1884* (2013.01); *Y02E 10/549* (2013.01)

(58) Field of Classification Search
CPC .......... C01B 31/022; C01B 2202/02–2202/36; B82Y 30/00; B82Y 40/00
USPC ..................................... 257/E51.04; 428/408
See application file for complete search history.

(56) References Cited

U.S. PATENT DOCUMENTS

| | | |
|---|---|---|
| 4,659,873 A | 4/1987 | Gibson et al. |
| 4,922,061 A | 5/1990 | Meadows et al. |
| 4,933,660 A | 6/1990 | Wynne, Jr. |

(Continued)

FOREIGN PATENT DOCUMENTS

| | | |
|---|---|---|
| CN | 2539375 | 3/2003 |
| CN | 1447279 | 10/2003 |

(Continued)

OTHER PUBLICATIONS

Fan et al. "Self-Oriented Regular Arrays of Carbon Nanotubes and Their Field Emission Properties". Science, vol. 283, (1999); pp. 512-514.*

(Continued)

*Primary Examiner* — Prashant J Khatri
(74) *Attorney, Agent, or Firm* — Novak Druce Connolly Bove + Quigg LLP (57) ABSTRACT

An electronic element includes a substrate, and a transparent conductive layer. The substrate includes a surface. The transparent conductive layer is formed on a surface of the substrate. The transparent conductive layer includes at least one carbon nanotube layer. Carbon nanotubes in the carbon nanotube layer are adhered together by the van der Waals attractive force therebetween.

1 Claim, 5 Drawing Sheets

(51) Int. Cl.
*H01L 51/44* (2006.01)
*H01L 31/18* (2006.01)

(56) References Cited

U.S. PATENT DOCUMENTS

| | | | |
|---|---|---|---|
| 5,181,030 A | 1/1993 | Itaya et al. | |
| 5,853,877 A * | 12/1998 | Shibuta | 428/357 |
| 5,861,583 A | 1/1999 | Schediwy et al. | |
| 5,931,764 A | 8/1999 | Freeman et al. | |
| 6,373,472 B1 | 4/2002 | Palalau et al. | |
| 6,423,583 B1 | 7/2002 | Avouris et al. | |
| 6,628,269 B2 | 9/2003 | Shimizu | |
| 6,629,833 B1 | 10/2003 | Ohya et al. | |
| 6,914,640 B2 | 7/2005 | Yu | |
| 6,947,203 B2 | 9/2005 | Kanbe | |
| 7,054,064 B2 | 5/2006 | Jiang et al. | |
| 7,060,241 B2 * | 6/2006 | Glatkowski | 423/447.1 |
| 7,071,927 B2 | 7/2006 | Blanchard | |
| 7,084,933 B2 | 8/2006 | Oh et al. | |
| 7,196,463 B2 | 3/2007 | Okai et al. | |
| 7,215,329 B2 | 5/2007 | Yoshikawa et al. | |
| 7,242,136 B2 | 7/2007 | Kim et al. | |
| 7,336,261 B2 | 2/2008 | Yu | |
| 7,348,966 B2 | 3/2008 | Hong et al. | |
| 7,355,592 B2 | 4/2008 | Hong et al. | |
| 7,532,182 B2 | 5/2009 | Tseng et al. | |
| 7,593,004 B2 | 9/2009 | Spath et al. | |
| 7,630,040 B2 | 12/2009 | Liu et al. | |
| 7,662,732 B2 | 2/2010 | Choi et al. | |
| 7,663,607 B2 | 2/2010 | Hotelling et al. | |
| 7,704,480 B2 | 4/2010 | Jiang et al. | |
| 7,710,649 B2 | 5/2010 | Feng et al. | |
| 7,796,123 B1 | 9/2010 | Irvin, Jr. et al. | |
| 7,825,911 B2 | 11/2010 | Sano et al. | |
| 7,854,992 B2 | 12/2010 | Fu et al. | |
| 7,947,977 B2 | 5/2011 | Jiang et al. | |
| 2002/0089492 A1 | 7/2002 | Ahn et al. | |
| 2003/0122800 A1 | 7/2003 | Yu | |
| 2003/0147041 A1 | 8/2003 | Oh et al. | |
| 2003/0165418 A1 * | 9/2003 | Ajayan et al. | 423/447.2 |
| 2003/0189235 A1 | 10/2003 | Watanabe et al. | |
| 2004/0047038 A1 | 3/2004 | Jiang et al. | |
| 2004/0053780 A1 | 3/2004 | Jiang et al. | |
| 2004/0099438 A1 | 5/2004 | Arthur et al. | |
| 2004/0105040 A1 | 6/2004 | Oh et al. | |
| 2004/0136896 A1 | 7/2004 | Liu et al. | |
| 2004/0191157 A1 | 9/2004 | Harutyunyan et al. | |
| 2004/0251504 A1 | 12/2004 | Noda | |
| 2005/0058834 A1 * | 3/2005 | Rueckes et al. | 428/408 |
| 2005/0110720 A1 | 5/2005 | Akimoto et al. | |
| 2005/0151195 A1 | 7/2005 | Kawase et al. | |
| 2005/0209392 A1 | 9/2005 | Luo et al. | |
| 2006/0010996 A1 | 1/2006 | Jordan et al. | |
| 2006/0022221 A1 | 2/2006 | Furukawa et al. | |
| 2006/0044284 A1 | 3/2006 | Tanabe | |
| 2006/0061704 A1 | 3/2006 | Hayano et al. | |
| 2006/0077147 A1 | 4/2006 | Palmateer et al. | |
| 2006/0097991 A1 | 5/2006 | Hotelling et al. | |
| 2006/0171032 A1 | 8/2006 | Nishioka | |
| 2006/0187213 A1 | 8/2006 | Su | |
| 2006/0187369 A1 | 8/2006 | Chang | |
| 2006/0188721 A1 | 8/2006 | Irvin, Jr. et al. | |
| 2006/0213251 A1 * | 9/2006 | Rinzler et al. | 73/23.2 |
| 2006/0240605 A1 | 10/2006 | Moon et al. | |
| 2006/0262055 A1 | 11/2006 | Takahara | |
| 2006/0263588 A1 | 11/2006 | Handa et al. | |
| 2006/0274047 A1 * | 12/2006 | Spath et al. | 345/173 |
| 2006/0274048 A1 | 12/2006 | Spath et al. | |
| 2006/0274049 A1 | 12/2006 | Spath et al. | |
| 2006/0275956 A1 | 12/2006 | Konesky | |
| 2006/0278444 A1 | 12/2006 | Binstead | |
| 2007/0065651 A1 | 3/2007 | Glatkowski et al. | |
| 2007/0075619 A1 | 4/2007 | Jiang et al. | |
| 2007/0081681 A1 | 4/2007 | Yu et al. | |
| 2007/0085838 A1 | 4/2007 | Ricks et al. | |

| | | |
|---|---|---|
| 2007/0099333 A1 | 5/2007 | Moriya |
| 2007/0165004 A1 | 7/2007 | Seelhammer et al. |
| 2007/0182720 A1 | 8/2007 | Fujii et al. |
| 2007/0215841 A1 | 9/2007 | Ford et al. |
| 2007/0257894 A1 | 11/2007 | Philipp |
| 2007/0262687 A1 | 11/2007 | Li |
| 2007/0279556 A1 | 12/2007 | Wang et al. |
| 2007/0296897 A1 | 12/2007 | Liu et al. |
| 2007/0298253 A1 | 12/2007 | Hata et al. |
| 2008/0007535 A1 | 1/2008 | Li |
| 2008/0029292 A1 | 2/2008 | Takayama et al. |
| 2008/0048996 A1 | 2/2008 | Hu et al. |
| 2008/0088219 A1 | 4/2008 | Yoon et al. |
| 2008/0095694 A1 | 4/2008 | Nakayama et al. |
| 2008/0129666 A1 | 6/2008 | Shimotono et al. |
| 2008/0138589 A1 | 6/2008 | Wakabayashi et al. |
| 2008/0192014 A1 | 8/2008 | Kent et al. |
| 2008/0238882 A1 | 10/2008 | Sivarajan et al. |
| 2008/0248235 A1 | 10/2008 | Feng et al. |
| 2008/0266273 A1 | 10/2008 | Slobodin et al. |
| 2009/0032777 A1 | 2/2009 | Kitano et al. |
| 2009/0056854 A1 | 3/2009 | Oh et al. |
| 2009/0059151 A1 | 3/2009 | Kim et al. |
| 2009/0101488 A1 | 4/2009 | Jiang et al. |
| 2009/0153511 A1 | 6/2009 | Jiang et al. |
| 2009/0153513 A1 | 6/2009 | Liu et al. |
| 2009/0153514 A1 | 6/2009 | Jiang et al. |
| 2009/0153516 A1 | 6/2009 | Liu et al. |
| 2009/0167709 A1 | 7/2009 | Jiang et al. |
| 2009/0208708 A1 | 8/2009 | Wei et al. |
| 2009/0283211 A1 | 11/2009 | Matsuhira |
| 2009/0293631 A1 | 12/2009 | Radivojevic |
| 2010/0001972 A1 | 1/2010 | Jiang et al. |
| 2010/0001975 A1 | 1/2010 | Jiang et al. |
| 2010/0001976 A1 | 1/2010 | Jiang et al. |
| 2010/0007619 A1 | 1/2010 | Jiang et al. |
| 2010/0007624 A1 | 1/2010 | Jiang et al. |
| 2010/0007625 A1 | 1/2010 | Jiang et al. |
| 2010/0065788 A1 | 3/2010 | Momose et al. |
| 2010/0078067 A1 | 4/2010 | Jia et al. |
| 2010/0093247 A1 | 4/2010 | Jiang et al. |
| 2010/0171099 A1 | 7/2010 | Tombler, Jr. et al. |
| 2010/0271330 A1 | 10/2010 | Philipp |
| 2011/0032196 A1 | 2/2011 | Feng et al. |
| 2012/0105371 A1 | 5/2012 | Hotelling et al. |

FOREIGN PATENT DOCUMENTS

| | | |
|---|---|---|
| CN | 1447279 A | 10/2003 |
| CN | 1482472 | 3/2004 |
| CN | 1483667 | 3/2004 |
| CN | 1484865 | 3/2004 |
| CN | 1501317 | 6/2004 |
| CN | 1503195 | 6/2004 |
| CN | 1509982 | 7/2004 |
| CN | 1519196 | 8/2004 |
| CN | 2638143 | 9/2004 |
| CN | 1543399 | 11/2004 |
| CN | 1543399 A | 11/2004 |
| CN | 2706973 | 6/2005 |
| CN | 1671481 | 9/2005 |
| CN | 1675580 | 9/2005 |
| CN | 1690915 A | 11/2005 |
| CN | 1738018 | 2/2006 |
| CN | 1744021 A | 3/2006 |
| CN | 1745302 | 3/2006 |
| CN | 1803594 | 7/2006 |
| CN | 1823320 | 8/2006 |
| CN | 1292292 C | 12/2006 |
| CN | 2844974 Y | 12/2006 |
| CN | 1903793 | 1/2007 |
| CN | 1942853 | 4/2007 |
| CN | 1947203 | 4/2007 |
| CN | 1948144 | 4/2007 |
| CN | 1315362 | 5/2007 |
| CN | 1982209 | 6/2007 |
| CN | 1996620 | 7/2007 |
| CN | 1998067 | 7/2007 |
| CN | 101017417 | 8/2007 |

(56) References Cited

FOREIGN PATENT DOCUMENTS

| | | |
|---|---|---|
| CN | 101059738 | 10/2007 |
| CN | 101165883 | 4/2008 |
| CN | 101239712 | 8/2008 |
| CN | 101248411 | 8/2008 |
| DE | 202007006407 | 9/2007 |
| EP | 1739692 | 1/2007 |
| JP | S61-231626 | 10/1986 |
| JP | 61-283918 | 12/1986 |
| JP | S62-63332 | 3/1987 |
| JP | 62-139028 | 6/1987 |
| JP | S62-182916 | 8/1987 |
| JP | S62-190524 | 8/1987 |
| JP | 1-214919 | 8/1989 |
| JP | H2-8926 | 1/1990 |
| JP | 1991-54624 | 3/1991 |
| JP | H3-54624 | 3/1991 |
| JP | 5-53715 | 3/1993 |
| JP | H06-28090 | 2/1994 |
| JP | H6-67788 | 3/1994 |
| JP | 8-287775 | 11/1996 |
| JP | H10-63404 | 3/1998 |
| JP | 10-246605 | 9/1998 |
| JP | 2001-34419 | 2/2001 |
| JP | 2001-267782 | 9/2001 |
| JP | 2002519754 | 7/2002 |
| JP | 2002-278701 | 9/2002 |
| JP | 2003-99192 | 4/2003 |
| JP | 2003-99193 | 4/2003 |
| JP | 2003-288164 | 10/2003 |
| JP | 2003303978 | 10/2003 |
| JP | 2004-26532 | 1/2004 |
| JP | 2004-102217 | 4/2004 |
| JP | 2004-189573 | 7/2004 |
| JP | 2004-253796 | 9/2004 |
| JP | 2004-266272 | 9/2004 |
| JP | 2005-67976 | 3/2005 |
| JP | 2005-85485 | 3/2005 |
| JP | 2005-117224 | 4/2005 |
| JP | 2005-176428 | 6/2005 |
| JP | 2005-182339 | 7/2005 |
| JP | 2005-222182 | 8/2005 |
| JP | 2005-286158 | 10/2005 |
| JP | 2006-171336 | 6/2006 |
| JP | 2006-228818 | 8/2006 |
| JP | 2006-243455 | 9/2006 |
| JP | 2006-521998 | 9/2006 |
| JP | 2006-269311 | 10/2006 |
| JP | 2006-285068 | 10/2006 |
| JP | 2007-11997 | 1/2007 |
| JP | 2007-31238 | 2/2007 |
| JP | 2007-73706 | 3/2007 |
| JP | 2007-112133 | 5/2007 |
| JP | 2007-123870 | 5/2007 |
| JP | 2007-161563 | 6/2007 |
| JP | 2007-161576 | 6/2007 |
| JP | 2007-182357 | 7/2007 |
| JP | 2007-182546 | 7/2007 |
| JP | 2007-229989 | 9/2007 |
| JP | 2007-299409 | 11/2007 |
| JP | 2007-310869 | 11/2007 |
| JP | 2008-102968 | 5/2008 |
| JP | 2008-139711 | 6/2008 |
| JP | 2008-536710 | 9/2008 |
| JP | 2008-542953 | 11/2008 |
| JP | 2009-104577 | 5/2009 |
| KR | 0525731 | 11/2005 |
| KR | 20060129977 | 12/2006 |
| KR | 20070012414 | 1/2007 |
| KR | 20070081902 | 8/2007 |
| KR | 2007-0108077 | 11/2007 |
| TW | 131955 | 4/1990 |
| TW | 341684 | 10/1998 |
| TW | 498266 | 8/2002 |
| TW | 508652 | 11/2002 |
| TW | 521227 | 2/2003 |
| TW | 200403498 | 3/2004 |
| TW | 242732 | 9/2004 |
| TW | 200518195 | 6/2005 |
| TW | I233570 | 6/2005 |
| TW | I234676 | 6/2005 |
| TW | 200522366 | 7/2005 |
| TW | 284963 | 1/2006 |
| TW | I249134 | 2/2006 |
| TW | I249708 | 2/2006 |
| TW | I251710 | 3/2006 |
| TW | I253846 | 4/2006 |
| TW | 200622432 | 7/2006 |
| TW | I258708 | 7/2006 |
| TW | I261716 | 9/2006 |
| TW | I267014 | 11/2006 |
| TW | M306694 | 2/2007 |
| TW | 200710493 | 3/2007 |
| TW | 200713337 | 4/2007 |
| TW | 200717083 | 5/2007 |
| TW | 200719198 | 5/2007 |
| TW | D117141 | 5/2007 |
| TW | 200722559 | 6/2007 |
| TW | 200727163 | 7/2007 |
| TW | 284927 | 8/2007 |
| TW | 200729241 | 8/2007 |
| TW | 200736979 | 10/2007 |
| TW | 200737414 | 10/2007 |
| TW | 200738558 | 10/2007 |
| TW | I287669 | 10/2007 |
| TW | 200926471 | 6/2009 |
| TW | 200928914 | 7/2009 |
| TW | 200929638 | 7/2009 |
| TW | 200929643 | 7/2009 |
| TW | 201005612 | 7/2009 |
| WO | WO02076724 | 10/2002 |
| WO | WO02076724 A1 | 10/2002 |
| WO | WO2004019119 | 3/2004 |
| WO | WO2004052559 | 6/2004 |
| WO | WO2004114105 | 12/2004 |
| WO | WO2005102924 | 11/2005 |
| WO | WO2005104141 | 11/2005 |
| WO | WO2006003245 | 1/2006 |
| WO | WO2006014241 | 2/2006 |
| WO | WO2006030981 | 3/2006 |
| WO | WO2006031981 | 3/2006 |
| WO | WO2006120803 | 11/2006 |
| WO | WO2006126604 | 11/2006 |
| WO | WO2006130366 | 12/2006 |
| WO | WO2007008518 | 1/2007 |
| WO | 2007012899 | 2/2007 |
| WO | 2007022226 | 2/2007 |
| WO | WO2007063751 | 6/2007 |
| WO | WO2007066649 | 6/2007 |
| WO | WO2007099975 | 9/2007 |
| WO | WO2008013517 | 1/2008 |

OTHER PUBLICATIONS

Wu et al. "Transparent, Conductive Carbon Nanotube Films". Science, vol. 305, (2004); pp. 1273-1276.*
ASM Handbook. "vol. 2 Properties and Selection: Nonferrous Alloys and Special-Purpose Materials". Apr. 2007; pp. 840-853.*
Susuki et al. "Investigation of physical and electric properties of silver pastes as binder for thermoelectric materials". Review of Scientific Instruments, 76, (2005); pp. 023907-1 to 023907-5.*
Dai, H. "Carbon nanotubes: opportunities and challenges". Surface Science 500 (2002), pp. 218-241.*
Kai-Li Jiang, Qun-Qing Li, Shou-Shan Fan, "Continuous carbon nanotube yarns and their applications" , Physics, China, pp. 506-510,Aug. 31, 2003,32(8)(lines from the 4th line to 35th line in the right column of p. 507 may be relevant).
Yu Xiang, Technique of Touch Panel & the Production of Resistance-type Touch Panel Insulation Dot, Journal of Longyan Teachers College, p. 25-26, vol. 22, No. 6, 2004.
George Gruner, "Carbon Nanonets Spark New Electronics", Scientific American, pp. 76-83, May 2007.
Ri Kurosawa, "Technology Trends of Capacitive Touch Panel", Technology and Development of Touch Panel, Amc, First Impression, pp. 54-64, Dec. 27, 2004(the 6th paragraph on p. 55 may be relevant).

(56) References Cited

OTHER PUBLICATIONS

Yoshikazu Nakayama, "Technology Development of CNT Long Yarns and CNT Sheets", Nano Carbon Handbook, Japan TSN INC, pp. 261-266, Jul. 17, 2007(the First 6 Sentences of 2nd, 3rd,4th Paragraphs and the first 3 sentences of 5th paragraph on p. 262,the 4th paragraph on p. 264 and the 5th sentence of 3rd paragraph on p. 265 may be relevant).

Yagasaki Takuya, Nakanishi Rou, "Resistance Film Type Touch Panel", Technologies and Developments of Touch Panels, Amc, First Impression, pp. 80-93, Dec. 27, 2004(the 2nd Paragraph on p. 81 and the 2nd Paragraph on p. 91 may be relevant).

Mei Zhang etal., "Strong Transparent, Multifunctional, Carbon Nanotube Sheets", Science, America, AAAS, vol. 309, pp. 1215-1219, Aug. 19, 2005.

Zhungchun Wu et al., "Transparent, Conductive Carbon Nanotube Films", Science, vol. 305, pp. 1273-1276, Aug. 27, 2004.

R Colin Johnson, "Carbon nanotubes aim for cheap, durable touch screens", Aug. 2007 http://psroc.phys.ntu.edu.tw/bimonth/v27/615.pdf.

Xianglin Liu, "strong, transparent, multifunctional carbon nanotube sheets", pp. 720-721, Oct. 2005 http://www.eettaiwan.com/articleLogin.do?artId=8800474428&fromWhere=/ART_8800474428_480502_NT_95e7014f.HTM&catId=480502&newsType=NT&pageNo=null&encode=95e7014f.

Strong, Transparent, Multifunctional, Carbon Nanotube Sheets, Science, American Association for the Advancement of Science, US, vol. 309, Aug. 19, pp. 1215-1219.

Spinning and Processing Continuous Yarns from 4-Inch wafer Scale Super-Aligned Carbon Nanotube Arrays, Advanced Materials, Wiley-Vchwerlag Gmbh&Co.KGAA,DE, vol. 18, No. 12, Jun. 1, 2006, pp. 1505-1510.

Spinning continuous carbon nanotube yarns, Nature, Nature Publishing Group, United Kingdom, vol. 419, Oct. 24, 2002, p. 801.

* cited by examiner

ELECTRONIC ELEMENT HAVING CARBON NANOTUBES

RELATED APPLICATIONS

This application is related to commonly-assigned applications entitled, “TOUCH PANEL”, U.S. application Ser. No. 12/286,266, filed Sep. 29, 2008; “TOUCH PANEL”, U.S. application Ser. No. 12/286,141, filed Sep. 29, 2008; “TOUCH PANEL AND DISPLAY DEVICE USING THE SAME”, U.S. application Ser. No. 12/286,189, filed Sep. 29, 2008; “TOUCH PANEL AND DISPLAY DEVICE USING THE SAME”, U.S. application Ser. No. 12/286,181, filed Sep. 29, 2008; “TOUCH PANEL AND DISPLAY DEVICE USING THE SAME”, U.S. application Ser. No. 12/286,176, filed Sep. 29, 2008; “TOUCH PANEL AND DISPLAY DEVICE USING THE SAME”, U.S. application Ser. No. 12/286,166, filed Sep. 29, 2008; “TOUCH PANEL AND DISPLAY DEVICE USING THE SAME”, U.S. application Ser. No. 12/286,178, filed Sep. 29, 2008; “TOUCH PANEL AND DISPLAY DEVICE USING THE SAME”, U.S. application Ser. No. 12/286,148, filed Sep. 29, 2008; “TOUCHABLE CONTROL DEVICE”, U.S. application Ser. No. 12/286,140, filed Sep. 29, 2008; “TOUCH PANEL AND DISPLAY DEVICE USING THE SAME”, U.S. application Ser. No. 12/286,154, filed Sep. 29, 2008; “TOUCH PANEL AND DISPLAY DEVICE USING THE SAME”, U.S. application Ser. No. 12/286,216, filed Sep. 29, 2008; “TOUCH PANEL AND DISPLAY DEVICE USING THE SAME”, U.S. application Ser. No. 12/286,152, filed Sep. 29, 2008; “TOUCH PANEL AND DISPLAY DEVICE USING THE SAME”, U.S. application Ser. No. 12/286,145, filed Sep. 29, 2008; “TOUCH PANEL, METHOD FOR MAKING THE SAME, AND DISPLAY DEVICE ADOPTING THE SAME”, U.S. application Ser. No. 12/286,155, filed Sep. 29, 2008; “TOUCH PANEL AND DISPLAY DEVICE USING THE SAME”, U.S. application Ser. No. 12/286,179, filed Sep. 29, 2008; “TOUCH PANEL, METHOD FOR MAKING THE SAME, AND DISPLAY DEVICE ADOPTING THE SAME”, U.S. application Ser. No. 12/286,228, filed Sep. 29, 2008; “TOUCH PANEL AND DISPLAY DEVICE USING THE SAME”, U.S. application Ser. No. 12/286,153, filed Sep. 29, 2008; “TOUCH PANEL AND DISPLAY DEVICE USING THE SAME”, U.S. application Ser. No. 12/286,184, filed Sep. 29, 2008; “METHOD FOR MAKING TOUCH PANEL”, U.S. application Ser. No. 12/286,175, filed Sep. 29, 2008; “METHOD FOR MAKING TOUCH PANEL”, U.S. application Ser. No. 12/286,195, filed Sep. 29, 2008; “TOUCH PANEL AND DISPLAY DEVICE USING THE SAME”, U.S. application Ser. No. 12/286,160, filed Sep. 29, 2008; “TOUCH PANEL AND DISPLAY DEVICE USING THE SAME”, U.S. application Ser. No. 12/286,220, filed Sep. 29, 2008; “TOUCH PANEL AND DISPLAY DEVICE USING THE SAME”, U.S. application Ser. No. 12/286,227, filed Sep. 29, 2008; “TOUCH PANEL AND DISPLAY DEVICE USING THE SAME”, U.S. application Ser. No. 12/286,144, filed Sep. 29, 2008; “TOUCH PANEL AND DISPLAY DEVICE USING THE SAME”, U.S. application Ser. No. 12/286,218, filed Sep. 29, 2008; “TOUCH PANEL AND DISPLAY DEVICE USING THE SAME”, U.S. application Ser. No. 12/286,142, filed Sep. 29, 2008; “TOUCH PANEL AND DISPLAY DEVICE USING THE SAME”, U.S. application Ser. No. 12/286,241, filed Sep. 29, 2008; “TOUCH PANEL, METHOD FOR MAKING THE SAME, AND DISPLAY DEVICE ADOPTING THE SAME”, U.S. application Ser. No. 12/286,151, filed Sep. 29, 2008; and “TOUCH PANEL, METHOD FOR MAKING THE SAME, AND DISPLAY DEVICE ADOPTING THE SAME”, U.S. application Ser. No. 12/286,219, filed Sep. 29, 2008. The disclosures of the above-identified applications are incorporated herein by reference.

BACKGROUND

1. Field of the Invention

The present invention relates to electronic elements and, particularly, to an electronic element including a plurality of carbon nanotubes.

2. Discussion of Related Art

Carbon nanotubes (CNTs) produced by means of arc discharge between graphite rods were reported in an article by Sumio Iijima, entitled “Helical Microtubules of Graphitic Carbon” (Nature, Vol. 354, Nov. 7, 1991, pp. 56-58). CNTs are electrically conductive along their length, chemically stable, and capable, individually, of having a very small diameter (much less than 100 nanometers) and large aspect ratios (length/diameter). Due to these and other properties, it has been suggested that CNTs can play an important role in various fields, such as field emission devices, new optic materials, sensors, soft ferromagnetic materials, etc.

Carbon nanotube layers have been found to be especially useful in field emission electron sources, photoelectric and biological sensors, transparent electrical conductors, battery electrodes, absorbing materials, water purification materials, light emitting materials, and related devices.

Generally, an electronic device, such as a liquid crystal display, field emission display, plasma display, electroluminescent display, vacuum fluorescent display, cathode ray tube, touch panel, or solar cell, includes an electronic element, which has a substrate and a transparent conductive layer. The transparent conductive layer is generally an indium tin oxide (ITO) layer.

However, the ITO layer is generally formed by means of ion-beam sputtering, and this method is relatively complicated. Furthermore, the ITO layer has generally poor mechanical durability, low chemical endurance, and uneven electrical resistance properties.

What is needed, therefore, is to provide an electronic element, the electronic element having low cost, excellent mechanical properties, uniform distribution of electrical resistance, and good transparency.

SUMMARY

An electronic element includes a substrate, and a transparent conductive layer. The substrate includes a surface. The transparent conductive layer is formed on a surface of the substrate. The transparent conductive layer includes at least one carbon nanotube layer. Carbon nanotubes in the carbon nanotube layer are adhered together by the van der Waals attractive force therebetween.

Other advantages and novel features of the present electronic element will become more apparent from the following detailed description of the present embodiments when taken in conjunction with the accompanying drawings.

BRIEF DESCRIPTION OF THE DRAWINGS

Many aspects of the present electronic element can be better understood with reference to the following drawings. The components in the drawings are not necessarily to scale, the emphasis instead being placed upon clearly illustrating the principles of the present electronic element.

Corresponding reference characters indicate corresponding parts throughout the several views. The exemplifications set out herein illustrate at least one embodiment of the present electronic element, in at least one form, and such exemplifications are not to be construed as limiting the scope of the invention in any manner.

DETAILED DESCRIPTION OF PREFERRED EMBODIMENTS

Reference will now be made to the drawings to describe, in detail, various embodiments of the present electronic element.

Figure 1:
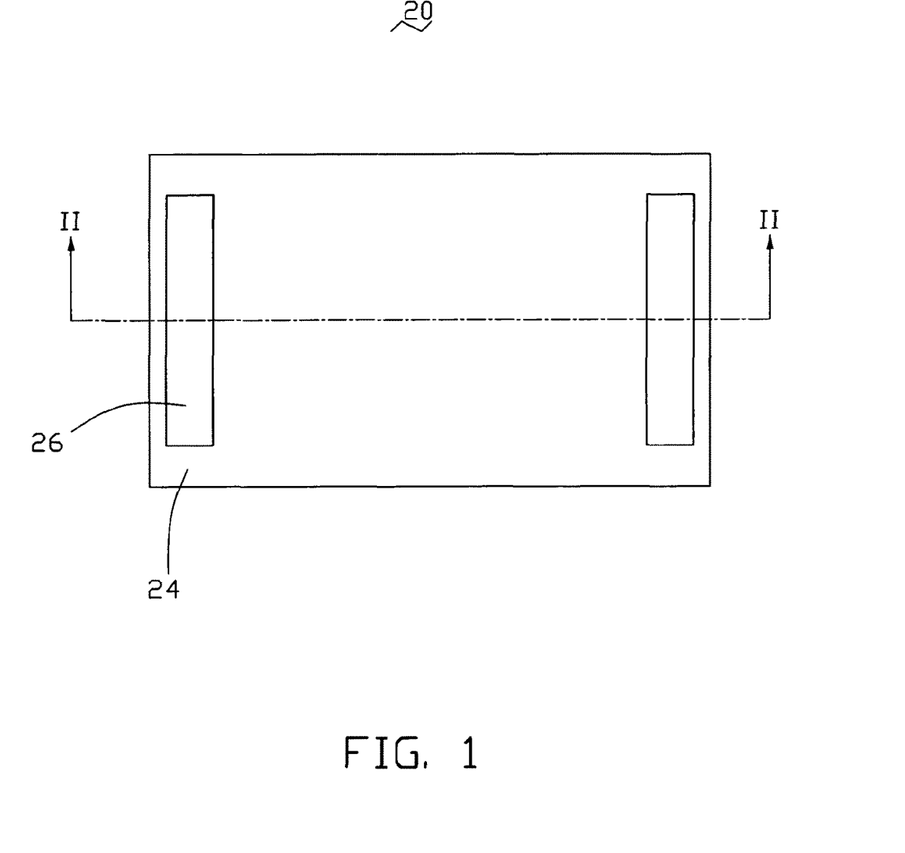
FIG. 1 is a plan view of an electronic element in accordance with a present embodiment.
Figure 2:
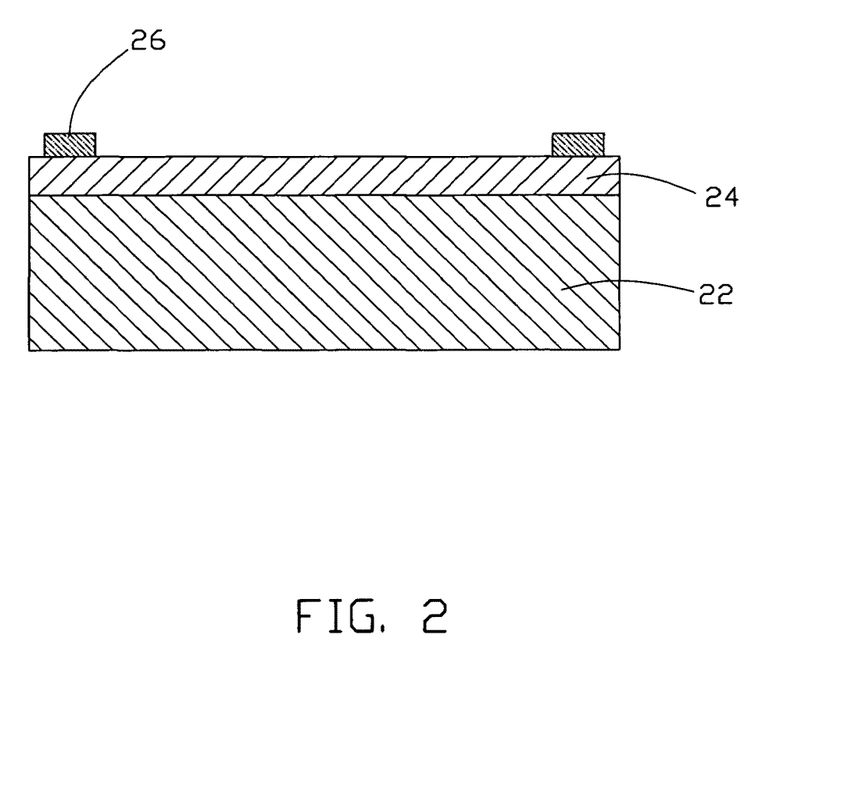
FIG. 2 is a cross-sectional view of the electronic element of FIG. 1, taken along a line II-II thereof.

Referring to FIG. 1 and FIG. 2, an exemplary electronic element 20 includes a substrate 22 and a transparent conductive layer 24.

Figure 4:
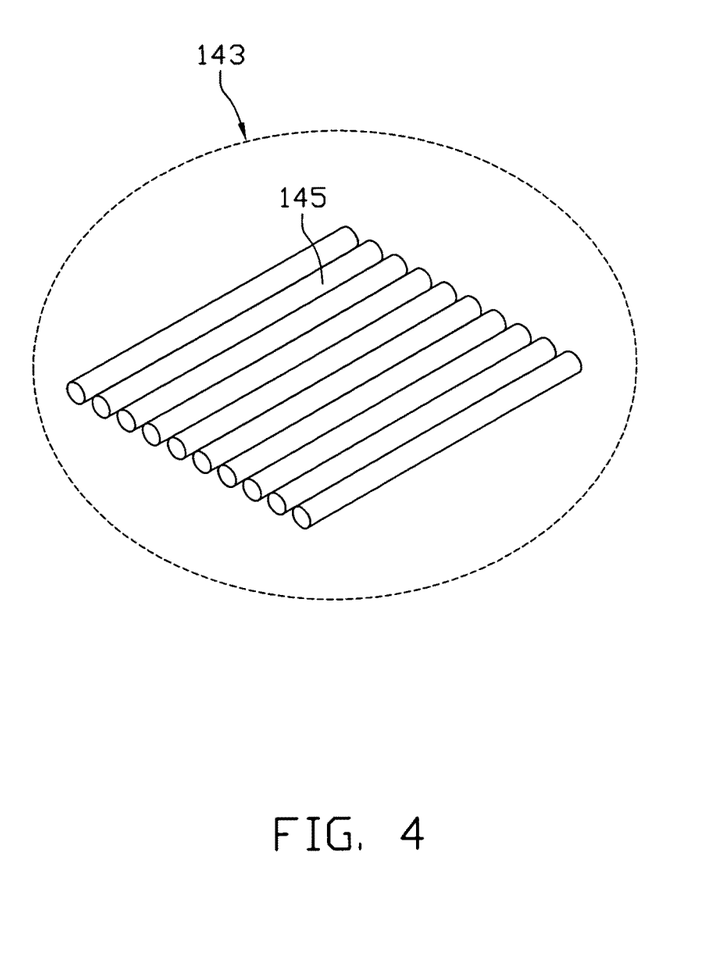
FIG. 4 is a structural schematic of a carbon nanotube segment.

The substrate 22 has a planar structure or a curved structure. In the illustrated embodiment, the substrate 22 has a planar structure. The material of the substrate 22 can be selected from the group consisting of glass, quartz, diamond, and plastic. Understandably, the substrate 22 can be made from material suitable in its transparency, flexibility, and hardness. Referring also to FIG. 4, the substrate 22 has a first surface 221 and a second surface 222 at opposite sides thereof respectively. The first surface 221 of the substrate 22 is used to support the transparent conductive layer 24.

The transparent conductive layer 24 includes at least one carbon nanotube layer. The carbon nanotube layer is formed by a plurality of carbon nanotubes, ordered or otherwise, and has a uniform thickness. The carbon nanotubes in the carbon nanotube layer are adhered together (i.e., combined, joined, or connected) by the van der Waals attractive force. Specifically, when the carbon nanotube layer contains the carbon nanotubes in a desired arrangement, the carbon nanotubes are parallel to a surface of the carbon nanotube layer, substantially uniform, and are each arranged parallel to the same fixed direction or are arranged along different directions. Further, the carbon nanotube layer includes one carbon nanotube film, or a plurality of carbon nanotube films contactingly disposed side by side. In the following description, unless the context indicates otherwise, it will be assumed that each carbon nanotube layer is a single carbon nanotube film. Due to the carbon nanotubes in the carbon nanotube layer are substantially parallel to a surface of the carbon nanotube layer, the transparency of the carbon nanotube layer are relatively high (for example, from 70%~99%).

In other embodiments, the transparent conductive layer 24 includes one carbon nanotube layer or at least two stacked carbon nanotube layers. Each carbon nanotube layer contains a plurality of carbon nanotubes, with the carbon nanotubes being arranged along a same direction. Further, the carbon nanotubes of any two adjacent carbon nanotube layers are arranged along different directions. A difference in the directions is defined as an angle α, which is in an approximate range from greater than 0° to less than or equal to 90° ($0<\alpha\leq90°$). The placing the films at an angle helps increase the strength of the overall structure. Having the films aligned will increase the efficiently of the transmission.

Due to the carbon nanotube layer being formed of a single carbon nanotube film or a plurality of carbon nanotube films contactingly disposed side by side, a length and a width of the carbon nanotube layer can be arbitrarily set as desired.

In a single carbon nanotube film, the carbon nanotubes can arranged orderly or disorderly (i.e., The carbon nanotube film can be an ordered film or a disordered film). In the ordered film, the carbon nanotubes are oriented along a same direction or different directions. In the disordered film, the carbon nanotubes are disordered or isotropic. The disordered carbon nanotubes are randomly entangled with each other. The isotropic carbon nanotubes are parallel to a surface of the carbon nanotube film.

In the present embodiment, the carbon nanotube film is ordered. Each carbon nanotube film includes a plurality of successive and oriented carbon nanotubes joined end to end by van der Waals attractive force therebetween. In the present embodiment, a thickness of the carbon nanotube film is in an approximate range from 0.5 nanometers to 100 micrometers. The carbon nanotubes in the carbon nanotube film can be selected from a group consisting of single-walled carbon nanotubes, double-walled carbon nanotubes, and multi-walled carbon nanotubes. A diameter of each single-walled carbon nanotube is in an approximate range from 0.5 nanometers to 50 nanometers. A diameter of each double-walled carbon nanotube is in an approximate range from 1 nanometer to 50 nanometers. A diameter of each multi-walled carbon nanotube is in an approximate range from 1.5 nanometers to 50 nanometers.

Figure 3:
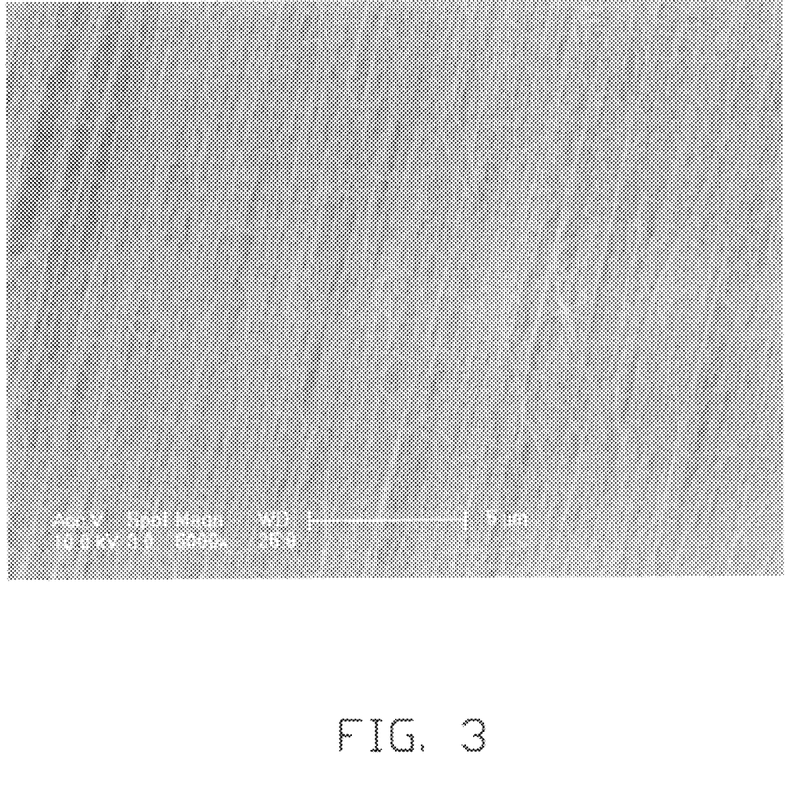
FIG. 3 shows a Scanning Electron Microscope (SEM) image of a carbon nanotube film used in the electronic element of FIG. 1.

Referring to FIGS. 3 and 4, each carbon nanotube film can comprises a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. The carbon nanotube segments 143 can vary in width, thickness, uniformity and shape. The carbon nanotubes 145 in the carbon nanotube film 143 are also oriented along a preferred orientation. As can be seen in FIG. 3, some variation will be present in the films.

In the present embodiment, the transparent conductive layer 24 includes two stacked carbon nanotube layers, and each carbon nanotube layer comprises a carbon nanotube film formed by pulling a plurality of carbon nanotubes out from an array of carbon nanotubes. Specifically, a method for fabricating the transparent conductive layer 24 includes the steps of: (a) providing an array of carbon nanotubes, specifically, a super-aligned array of carbon nanotubes; (b) pulling out a carbon nanotube film from the array of carbon nanotubes, by using a tool (e.g., adhesive tape, pliers, tweezers, or another tool allowing multiple carbon nanotubes to be gripped and pulled simultaneously); and (c) fabricating two of the above-described carbon nanotube layers, and stacking them, whereby an angle α between the alignment directions of the carbon nanotubes in the two adjacent carbon nanotube films is in the range $0<\alpha\leq90°$.

In step (a), a given super-aligned array of carbon nanotubes can be formed by the substeps of: (a1) providing a substantially flat and smooth substrate; (a2) forming a catalyst layer on the substrate; (a3) annealing the substrate with the catalyst layer in air at a temperature in the approximate range from 700° C. to 900° C. for about 30 to 90 minutes; (a4) heating the substrate with the catalyst layer to a temperature in the approximate range from 500° C. to 740° C. in a furnace with a protective gas therein; and (a5) supplying a carbon source gas to the furnace for about 5 to 30 minutes and growing the super-aligned array of carbon nanotubes on the substrate.

In step (a1), the substrate can be a P-type silicon wafer, an N-type silicon wafer, or a silicon wafer with a film of silicon dioxide thereon. A 4-inch P-type silicon wafer is used as the substrate in the present embodiment.

In step (a2), the catalyst can be made of iron (Fe), cobalt (Co), nickel (Ni), or any alloy thereof.

In step (a4), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any suitable combination thereof.

The super-aligned array of carbon nanotubes can have a height of about 50 microns to 5 millimeters, the super-aligned array of carbon nanotubes including a plurality of carbon nanotubes parallel to each other and approximately perpendicular to the substrate. The carbon nanotubes can be selected from a group consisting of single-walled carbon nanotubes, double-walled carbon nanotubes, and multi-walled carbon nanotubes. A diameter of each single-walled carbon nanotube is in an approximate range from 0.5 nanometers to 50 nanometers. A diameter of each double-walled carbon nanotube is in an approximate range from 1 nanometer to 50 nanometers. A diameter of each multi-walled carbon nanotube is in an approximate range from 1.5 nanometers to 50 nanometers.

The super-aligned array of carbon nanotubes formed under the above conditions is essentially free of impurities, such as carbonaceous or residual catalyst particles. The carbon nanotubes in the super-aligned array are closely packed together by van der Waals attractive force.

In step (b), the carbon nanotube film or yarn, can be formed by the substeps of: (b1) selecting one or more carbon nanotubes having a predetermined width from the array of carbon nanotubes; and (b2) pulling the carbon nanotubes to form nanotube segments 143 at an even/uniform speed to achieve a uniform carbon nanotube film or carbon nanotube yarn. A carbon nanotube yarn is primarily a very narrow carbon nanotube film.

In step (b1), quite usefully, the carbon nanotube segment 143 includes a plurality of carbon nanotubes 145 parallel to each other. The carbon nanotube segments 143 can be selected by using an adhesive tape as the tool to contact the super-aligned array of carbon nanotubes. In step (b2), the pulling direction is substantially perpendicular to the growing direction of the super-aligned array of carbon nanotubes.

More specifically, during the pulling process, as the initial carbon nanotube segments are drawn out, other carbon nanotube segments are also drawn out end to end due to van der Waals attractive force between ends of adjacent segments. This process of drawing ensures a substantially continuous and uniform carbon nanotube film having a predetermined width can be formed. Referring to FIG. 3, the carbon nanotube film includes a plurality of carbon nanotubes joined ends to ends. The carbon nanotubes in the carbon nanotube film are all substantially parallel to the pulling/drawing direction of the carbon nanotube film, and the carbon nanotube film produced in such manner can be selectively formed to have a predetermined width. The carbon nanotube film formed by the pulling/drawing method has superior uniformity of thickness and conductivity over a typical disordered carbon nanotube film. Further, the pulling/drawing method is simple, fast, and suitable for industrial applications.

The width of the carbon nanotube film depends on, inter alia, a size of the carbon nanotube array. The length of the carbon nanotube film can be arbitrarily set, as desired. In one useful embodiment, when the substrate is a 4-inch P-type silicon wafer, the width of the carbon nanotube film is in an approximate range from 0.05 nanometers to 10 centimeters, and the thickness of the carbon nanotube film is in the approximate range from 0.5 nanometers to 100 micrometers. The carbon nanotubes in the carbon nanotube film can be selected from a group consisting of single-walled carbon nanotubes, double-walled carbon nanotubes, and multi-walled carbon nanotubes. Diameters of the single-walled carbon nanotubes are in an approximate range from 0.5 nanometers to 50 nanometers. Diameters of the double-walled carbon nanotubes are in an approximate range from 1 nanometer to 50 nanometers. Diameters of the multi-walled carbon nanotubes are in an approximate range from 1.5 nanometers to 50 nanometers.

It is noted that because the carbon nanotubes in the super-aligned carbon nanotube array have a high purity and a high specific surface area, the carbon nanotube film is adherent in nature. As such, each carbon nanotube film can be directly adhered to a surface of the substrate 22 and/or the other carbon nanotube film. In the alternative, other bonding means can be applied.

In step (c), each carbon nanotube layer only includes a single carbon nanotube film or multiple coplanar films. Each carbon nanotube film includes a plurality of carbon nanotubes arranged along a same direction. The same direction is the pulling direction. As such, the two carbon nanotube layers are arranged and stacked with the angle α being in the range $0 < \alpha \leq 90°$.

Once the carbon nanotube films are adhered to the surface of the substrate 22, the carbon nanotube films can be treated with an organic solvent. Specifically, the carbon nanotube film can be treated by applying organic solvent to the carbon nanotube film to soak the entire surface of the carbon nanotube film. For example, the carbon nanotube films can be treated by dropping the organic solvent from a dropper onto the carbon nanotube films to soak the entire surfaces of the carbon nanotube films. The organic solvent is volatile and can be selected from the group consisting of ethanol, methanol, acetone, dichloroethane, chloroform, any appropriate mixture thereof. In the present embodiment, the organic solvent is ethanol. After being soaked by the organic solvent, microscopically, carbon nanotube strings will be formed by adjacent carbon nanotubes in the carbon nanotube film, that are able to do so, bundling together, due to the surface tension of the organic solvent. In one aspect, part of the carbon nanotubes in the untreated carbon nanotube film that are not adhered on the substrate will come into contact with the surface of the substrate 22, after the organic solvent treatment due to the surface tension of the organic solvent. Then the contacting area of the carbon nanotube film with the substrate will increase, and thus, the carbon nanotube film can more firmly adhere to the surface of the substrate 22. In another aspect, due to the decrease of the specific surface area via bundling, the mechanical strength and toughness of the carbon nanotube film are increased and the coefficient of friction of the carbon nanotube films is reduced. Macroscopically, the film will be an approximately uniform carbon nanotube film.

Unlike previous methods for making an ITO film, the present method does not require a vacuum environment and heat processing, due to the carbon nanotube films being obtained by pulling out from an array of carbon nanotubes. Thus, the carbon nanotube layers formed by the carbon nanotube films and used as the transparent conductive layer 24 have the advantage of being low cost, environmentally safe, and energy efficient.

At least two electrodes 26 can be disposed on a surface of the transparent conductive layer 24. The electrodes 26 can be disposed on the surface of the transparent conductive layer 24 that faces away from the substrate 22. Further or alternatively, the electrodes 26 can be configured to be sandwiched between the substrate 22 and the transparent conductive layer 24, to insure that the electrodes 26 electrically connect with the transparent conductive layer 24. Typically, the substrate 22 is a glass substrate. The electrodes 26 are strip-shaped, and can be formed by metallic layers, conductive resin layers, carbon nanotube films or any other suitable materials. The electrodes 26 are formed by one or more of spraying, electrical deposition, and electroless deposition methods. Moreover, the electrodes 26 can also be adhered to the surface of the transparent conductive layer 24 by a silver-based slurry.

It is to be noted that, after photoetching or laser etching of the transparent conductive layer 24 to form patterned circuits, the electronic element 20 can be used in apparatuses such as flat displays, photo-electric devices, touch panels, thermal emission elements (such as heaters), electroluminescence displays, and electromagnetic interference (EMI) shielding.

When the electronic element 20 is used as a heater, the electronic element includes two electrodes 26. The electrodes 26 are connected to an electrical source by conductive wires. Further, it is imperative that the electrodes 26 are separated by a certain distance to form a certain resistance therebetween, thereby preventing short-circuiting of the electrodes 26. As such, in use, the transparent conductive layer 24 emits electromagnetic waves with a certain wavelength.

Figure 5:
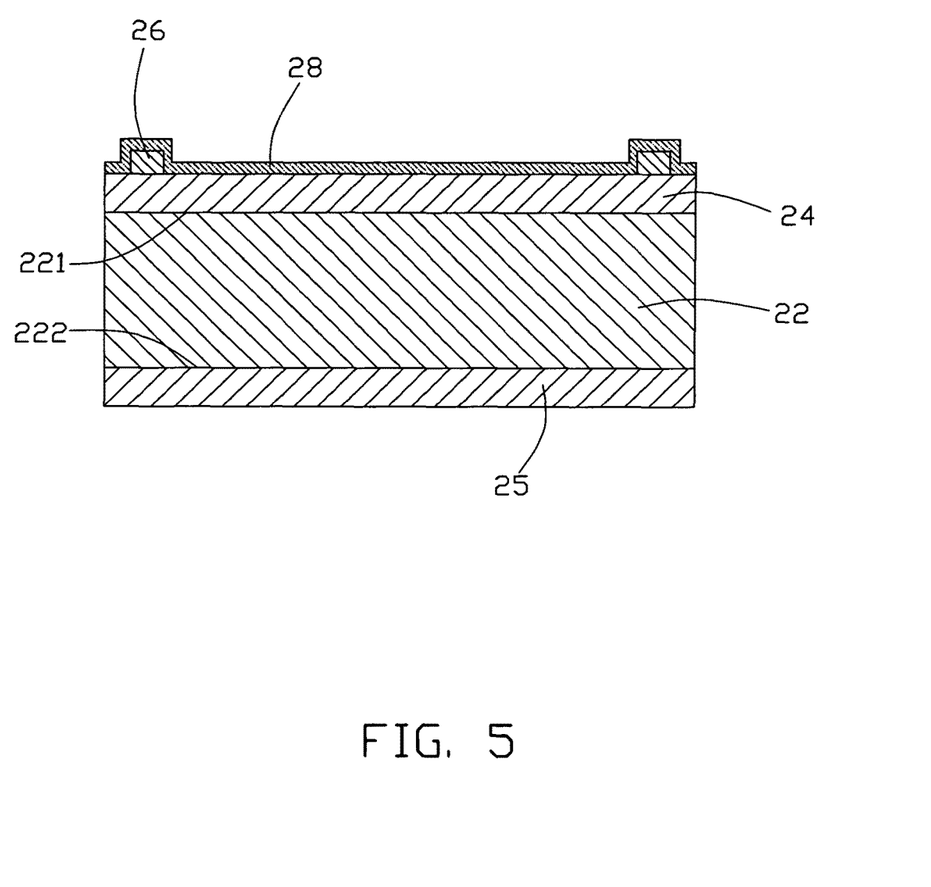
FIG. 5 is a cross-sectional view of a touch panel incorporating the electronic element of FIG. 1, the view corresponding to line II-II of FIG. 1.

Referring to FIG. 5, when the electronic element 20 is used in a touch panel, the touch panel typically includes the electronic element 20, a transparent protective film 28, and a shielding layer 25. The shielding layer 25 is disposed on the second surface 222 of the substrate 22. The transparent protective film 28 together with the electrodes 26 are disposed on the surface of the transparent conductive layer 24 that faces away from the substrate 22. In operation, a voltage is applied to the electrodes 26 respectively. A user presses or touches the transparent conductive layer 24 with a touch tool, such as a finger or an electrical pen/stylus, while visually observing an associated display element through the touch panel. Due to an electrical field of the user, a coupling capacitance forms between the user and the transparent conductive layer 24. For high frequency electrical current, the coupling capacitance is a conductor, and thus the touch tool takes away a little current from the touch point. Currents flowing through the two electrodes 26 cooperatively replace the current lost at the touch point. The quantity of current supplied by each electrode 26 is directly proportional to the distances from the touch point to the electrodes 26. A touch panel controller connected with the touch panel is used to calculate the proportion of the two supplied currents, thereby detecting coordinates of the touch point on the touch panel. Then the touch panel controller sends the coordinates of the touch point to an associated central processing unit (CPU). The CPU receives the coordinates, and processes the coordinates into a command. The CPU then sends out the command to an associated display element controller that is also connected to the display element. The display element controller controls the display of the display element accordingly.

The carbon nanotube layers provided in the present embodiment have superior properties, such as excellent toughness, high mechanical strength, and uniform conductivity. Thus, the electronic element 20 is durable and highly conductive. Further, the pulling method for fabricating the carbon nanotube layers is simple, and the adhesive carbon nanotube layers can be disposed directly on the substrate 22 and on each other. As such, the method for fabricating the carbon nanotube layers is suitable for the mass production of the electronic element 20, and reduces the cost thereof. Moreover, each carbon nanotube layer has a uniform distribution of electrical resistance, thus improving the electrical properties of the electronic element 20.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:
1. An electronic element comprising:
a substrate comprising a surface; and
a transparent conductive layer comprising at least two carbon nanotube films directly stacked and located on the surface of the substrate,
wherein each of the at least two carbon nanotube films comprises carbon nanotubes oriented along a primary orientation and substantially parallel to a surface of the each of the at least two carbon nanotube films, the surface of the each of the at least two each carbon nanotube films is parallel to the surface of the substrate, the carbon nanotubes in the each of the at least two carbon nanotube films are joined end to end along the primary orientation, an angle exists between the primary orientations of the carbon nanotubes of two adjacent carbon nanotube films, and the angle is in between 0° and 90°.

* * * * *